(12) United States Patent
Ahn et al.

(10) Patent No.: US 6,288,586 B1
(45) Date of Patent: Sep. 11, 2001

(54) CIRCUIT FOR STANDBY CURRENT REDUCTION

(75) Inventors: Jin Hong Ahn, Kyungki-do; Joo Hiuk Son, Chungcheongbuk-do, both of (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/243,469

(22) Filed: Feb. 3, 1999

(30) Foreign Application Priority Data

Feb. 12, 1998 (KR) ........................................... 98-4191

(51) Int. Cl.⁷ ................................................... H03K 3/02
(52) U.S. Cl. ........................... 327/199; 327/210; 327/211; 326/95
(58) Field of Search ................................... 327/199, 200, 327/202, 203, 208, 210, 211, 212, 223, 379; 326/95, 98; 257/369, 372

(56) References Cited

U.S. PATENT DOCUMENTS

| | | | |
|---|---|---|---|
| 4,486,673 | * 12/1984 | Koike | 327/210 |
| 4,734,597 | * 3/1988 | Ullrich et al. | 326/98 |
| 5,245,209 | * 9/1993 | Ishigaki | 257/372 |
| 5,304,833 | * 4/1994 | Shigeki et al. | 257/372 |
| 5,329,175 | * 7/1994 | Peterson | 327/170 |
| 5,592,114 | * 1/1997 | Wu et al. | 327/208 |
| 5,642,061 | * 6/1997 | Gorny | 326/98 |
| 5,781,052 | * 6/1998 | Kleine | 327/208 |
| 5,917,355 | * 6/1999 | Klass | 327/208 |

\* cited by examiner

*Primary Examiner*—Timothy P. Callahan
*Assistant Examiner*—An T. Luu
(74) *Attorney, Agent, or Firm*—Fleshner & Kim, LLP

(57) ABSTRACT

Circuit for reducing a standby current, is disclosed, including a PMOS transistor connected to a power supply voltage terminal, an NMOS transistor connected to a ground voltage terminal, and a switching device between the PMOS transistor and the NMOS transistor for cutting off a leakage current flowing to the NMOS transistor through the PMOS transistor, whereby minimizing a leakage current and shortening a time period for going from a standby state to an active state.

15 Claims, 5 Drawing Sheets

CIRCUIT FOR STANDBY CURRENT REDUCTION

BACKGROUND OF THE INVENTION

1. Field of the Invention

The present invention relates to a semiconductor device, and more particularly, to a circuit for reducing a standby current occurred in a low voltage circuit.

2. Discussion of the Related Art

In general, a transistor voltage is lowered for reducing a signal transmission speed in the low voltage circuit, causing significant increase of a threshold leakage current during the standby, of which reduction becomes a key problem.

A background art circuit for reducing a standby current will be explained with reference to the attached drawings. In the background art circuit for reducing a standby current, for reducing leakage currents flowing through a plurality of logic circuit units, PMOS transistors and NMOS transistors, both with high threshold voltages are provided external to the logic circuit units for controlling the leakage currents flowing through an entire circuit.

FIG. 1 illustrates a first exemplary background art circuit for reducing a standby current.

Referring to FIG. 1, the first exemplary background art circuit for reducing a standby current is provided with a main power supply line Vcc and a ground line Vss, a sub-power supply line Vcc-L and a sub-ground line Vss-L, a PMOS transistor HPM1 between the main power supply line and the sub-power supply line, an NMOS transistor HNM1 between the main ground line and the sub-ground line, and a plurality of logic circuits 11 between the sub-power supply line and the sub-ground line. Each of the logic circuits 11 is provided with a plurality of PMOS transistors and NMOS transistors, both of low threshold voltages. The PMOS transistor HPM1 between the main power supply line and the sub-power supply line and the NMOS transistor HNM1 between the main ground line and the sub-ground line have threshold voltages relatively higher than the transistors in the logic circuits 11. The NMOS transistor HNM1 has a gate adapted to be applied of an active signal ACT, and the PMOS transistor HPM1 has a gate adapted to be applied of an active bar signal $\overline{ACT}$.

The operation of the first exemplary background art circuit for reducing a standby current will be explained.

As shown in FIG. 1, when the circuit is active, the PMOS transistor HPM1 and the NMOS transistor HNM1 are turned on, to charge the sub-power supply line Vcc-L to a voltage of Vcc level and the sub-ground line Vss-L to a voltage of Vss level. Accordingly, the circuit is operative as a general circuit in which an output is provided according to a system of the logic circuit 11. When the circuit is standby, the PMOS transistor HPM1 and the NMOS transistor HNM1 are turned off, causing the sub-power supply line and the sub-ground line separated from the main power supply line and the main ground line respectively, to make a voltage on the sub-power supply line to become a power supply voltage applied to the plurality of logic circuit 11 and a voltage on the sub-ground line to become a ground voltage applied on the logic circuit 11. In this instance, the leakage current flowing through the logic circuit is increased as the power supply voltage is the higher, and vice versa. By separating the sub-power supply line and the sub-ground line from the main power supply line and the main ground line respectively, the power supply voltage to the logic circuit 11 can be lower, leading to a reduction of the leakage current using such a characteristic.

FIG. 2 illustrates a second exemplary background art circuit for reducing a standby current.

Referring to FIG. 2, the second exemplary background art circuit for reducing a standby current is provided with a main power supply line Vcc, a main ground line Vss, a sub-power supply line Vcc-L, a sub-ground line Vss-L, a PMOS transistor HPM1 between the main power supply line and the sub-power supply line, an NMOS transistor HNM1 between the main ground line and the sub-ground line, a first logic circuit 21 between the main-power supply line and the sub-ground line and a second logic circuit 21a between the sub-power supply line and the main ground line. There may be a plurality of logic circuits other than the first, and second logic circuits 21 and 21a depending on a circuit system. The first, and second logic circuits 21 and 21a are provided with a plurality of PMOS transistors and a plurality of NMOS transistors, wherein logic circuits having transistors turned on predicting standby states in advance are connected to the main power supply line and the sub-ground line and logic circuits having transistors turned off predicting standby states in advance are connected to the sub-power supply line and the main-ground line, thereby reducing loads on the sub-power supply line and sub-ground line to half when the two logic circuits 21 and 21a are operative.

However, the background art circuits for reducing a standby current have the following problems.

First, the optimization of sizes of transistors connecting main power supply line and sub-power supply line and main ground line and the sub-ground line for adjusting a time period required for returning from a standby state to an active state requires a long time.

Second, application of the circuit to a circuit automatic composition is difficult, in which the circuit is designed in a top-down fashion utilizing a netlist in which circuit design formats are provided as texts.

Third, the circuit requires much area and is complicated.

Fourth, the transistors of high threshold voltages provided between main power supply line and sub-power supply line and main ground line and the sub-ground line act like capacitors at returning from a standby state to an active state, causing the sub-power supply line and the sub-ground line to require much time periods in restoring to voltages identical to the voltages on the main power supply line and main ground line.

SUMMARY OF THE INVENTION

Accordingly, the present invention is directed a circuit for reducing a standby circuit that substantially obviates one or more of the problems due to limitations and disadvantages of the related art.

An object of the present invention is to provide a circuit for reducing a standby current which can minimize a leakage current, shorten a time period returning from a standby state back to an active state to a maximum, and allow automatic composition of the circuit, to overcome a limit of a current technology.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the circuit for reducing a standby current includes a PMOS transistor connected to a power supply voltage terminal, an NMOS transistor connected to a ground voltage terminal, and a switching device between the PMOS transistor and the NMOS transistor for cutting off a leakage current flowing to the NMOS transistor through the PMOS transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
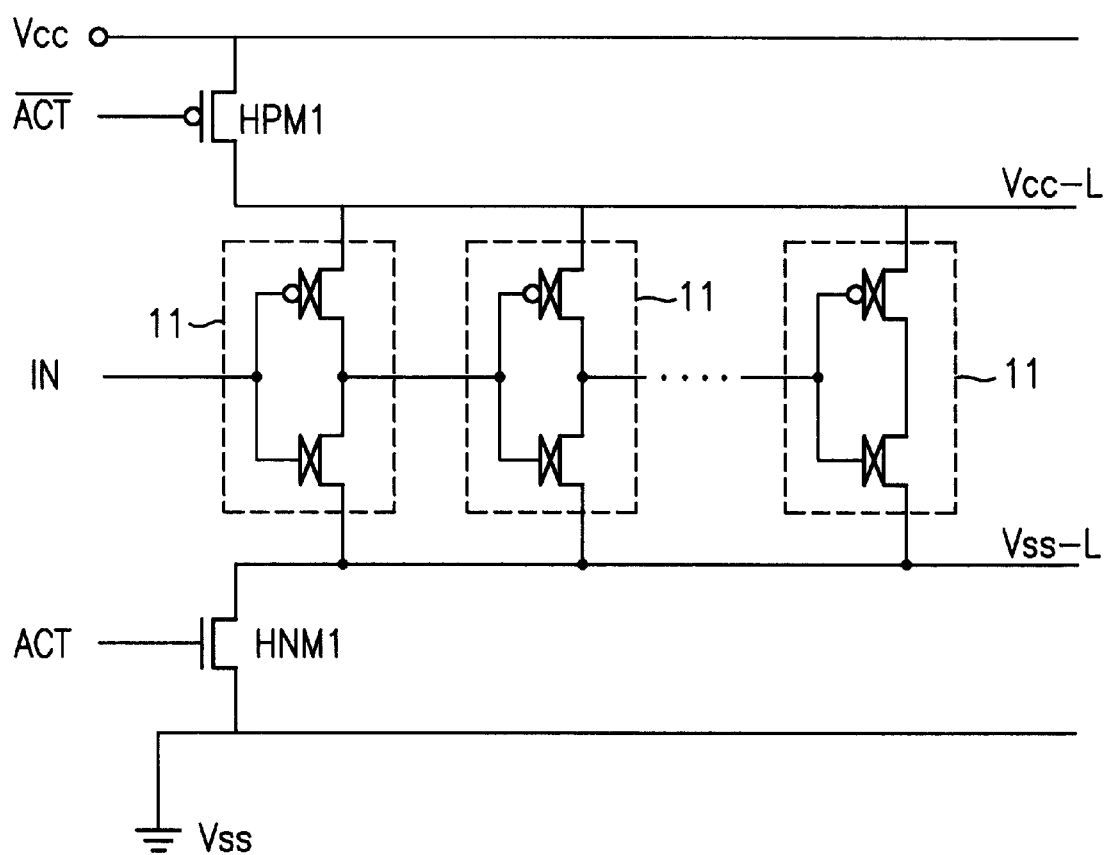
FIG. 1 illustrates a first exemplary background art circuit for reducing a standby current.
Figure 2:
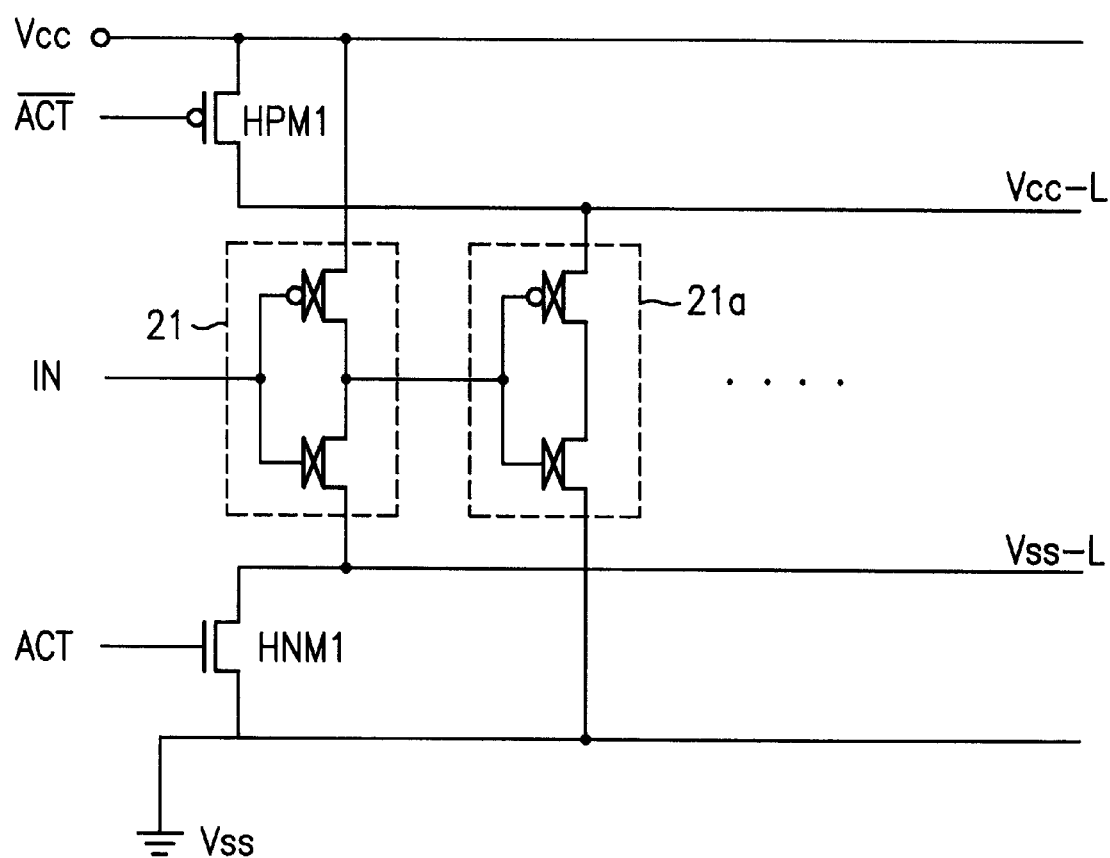
FIG. 2 illustrates a second exemplary background art circuit for reducing a standby current.
Figure 3:
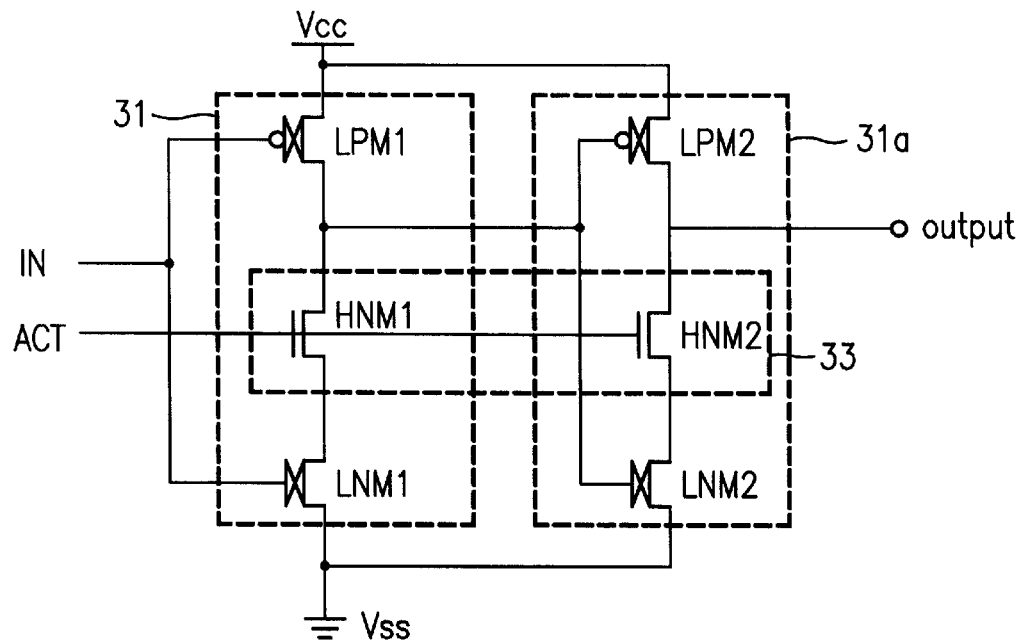
FIG. 3 illustrates a circuit for reducing a standby current in accordance with a first preferred embodiment of the present invention.

Reference will now be made in detail to the preferred embodiments of the present invention, examples of which are illustrated in the accompanying drawings. In a circuit for reducing a standby current of the present invention, a switching device(in the embodiment of the present invention, an NMOS transistor or a PMOS transistor) is provided to each of the plurality of logic circuits, for reducing leakage currents. FIG. 3 illustrates a circuit for reducing a standby current in accordance with a first preferred embodiment of the present invention.

Referring to FIG. 3, the circuit for reducing a standby current in accordance with a first preferred embodiment of the present invention includes a power supply voltage terminal Vcc, a ground voltage terminal Vss and a plurality of logic circuits 31 between the power supply voltage terminal and the ground voltage terminal. Each of the logic circuits 31 includes a PMOS transistor of a low threshold voltage LPM1 and an NMOS transistor of a low threshold voltage LNM1, with a source of the PMOS transistor LPM1 connected to the power supply voltage terminal and a source of the NMOS transistor LNM1 connected to the ground voltage terminal. A switching device 33, for example an NMOS transistor of a high threshold voltage HNM1 (hereafter called as "selection transistor"), is provided between the PMOS transistor LPM1 and the NMOS transistor LNM1 for reducing a leakage current. The selection transistor 33 is provided to each of the plurality of the logic circuits and is turned on in an active operation and turned off in a standby operation.

Figure 4:
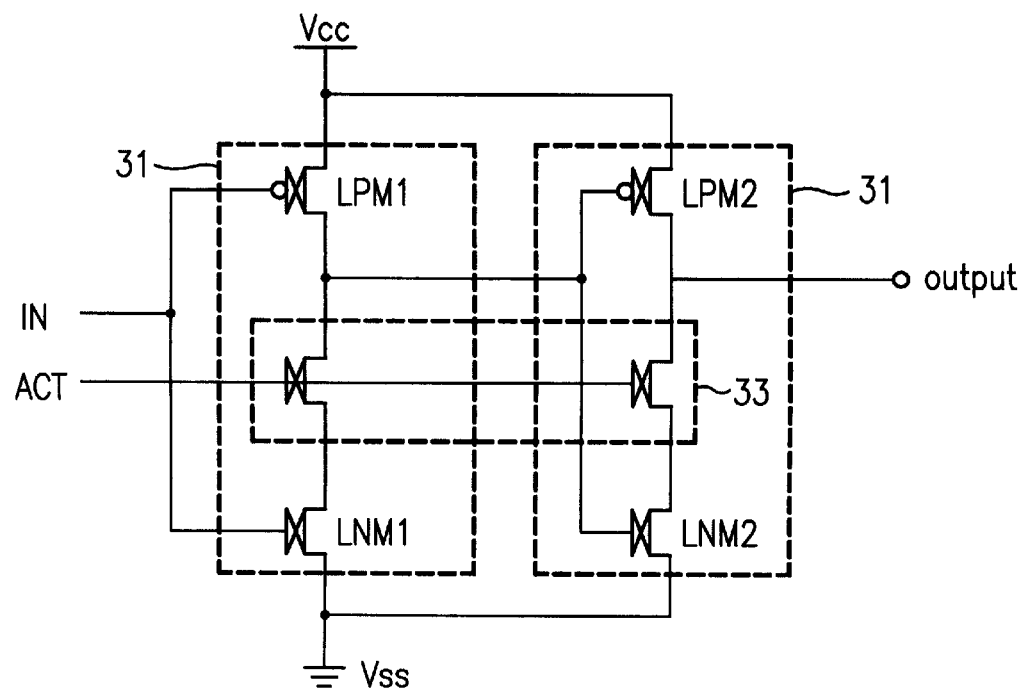
FIG. 4 illustrates a circuit for reducing a standby current in accordance with a second preferred embodiment of the present invention.

The selection transistor may be an NMOS transistor HNM1 of a high threshold voltage in place of the NMOS transistor of a low threshold voltage. A circuit for reducing a standby current of the NMOS of a low voltage application is illustrated in FIG. 4. FIG. 4 illustrates a circuit for reducing a standby current in accordance with a second preferred embodiment of the present invention, showing the selection transistor being the NMOS transistor of a low threshold voltage in comparison to the circuit of FIG. 3.

The operations of the aforementioned circuits for reducing a standby current in accordance with the first, and second preferred embodiments of the present invention will be explained.

Referring to FIGS. 3 and 4, the gate of the selection transistor is provided with a high signal in an active operation and is provided with a low signal in a standby operation (0V in the case of FIG. 3, and a negative(−) voltage for reducing a leakage current in the case of FIG. 4). Namely, upon application of a low signal to the gate of the selection transistor in a standby, the selection transistor 33 is turned off, cutting off a leakage current path from the PMOS transistor LPM1 to the NMOS transistor LNM1. The cut-off of the leakage current path by turning off the selection transistor 33 can reduce a sub-threshold leakage current significantly(according to a simulation, the reduction is approx. 10,000 times compared to the background art.). And, a time period required for reaching to a standby state from an active state is reduced significantly compared to the background art which is provided with the main power supply line and the main ground line and the sub-power supply line and the sub-ground line. Thus, the first, and second embodiment circuit for reducing a standby current of the present invention provides selection transistors in logic circuits having the PMOS transistor LPM1 and the NMOS transistor LNM1, for cutting off leakage currents flowing from the PMOS transistors LPM1 to the NMOS transistors LNM1. In the first, and second embodiments, though logic circuits formed with invertors each having one PMOS transistor and one NMOS transistor are shown as examples, the present invention is applicable to all logic circuits irrespective of numbers of the PMOS transistors and the NMOS transistors in the logic circuits. That is, the logic circuit is inclusive of all logic circuits such as invertors, NAND gates and NOR gates.

Figure 5:
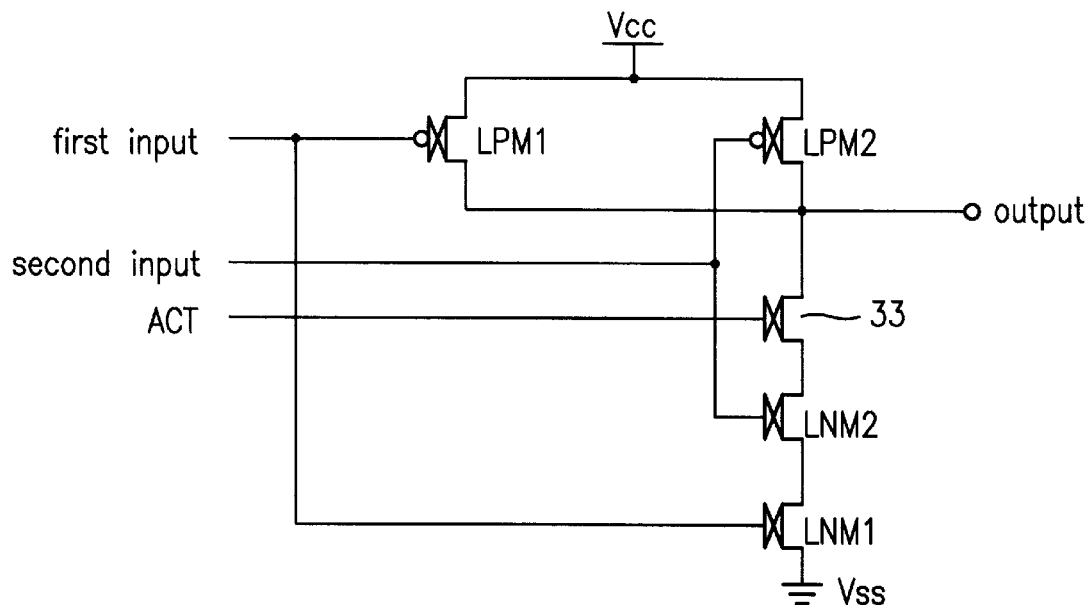
FIG. 5 illustrates an NAND gate application of the first, and second embodiments of the present invention.

FIG. 5 illustrates an NAND gate application of the first, and second embodiments of the present invention, including a first PMOS transistor LPM1 and a first NMOS transistor LNM1, operation states of both of which are determined in response to a first input signal, a second PMOS transistor LPM2 and a second NMOS transistor LNM2, operation states of both of which are determined in response to a second input signal, and a selection transistor 33 between the second PMOS transistor LPM2 and the second NMOS transistor LNM2. In this instance, the selection transistor 33 is turned on in an active operation and turned off in a standby. Also, in the logic circuit of NAND gate, the selection transistor 33 is provided between the second PMOS transistor LPM2 and the second NMOS transistor LMN2, for cutting off of leakage currents flowing from the second PMOS transistor LPM2 to the second NMOS transistor LNM2 in a standby. Thus, not only the NAND gate, but also all logic circuits, such as NOR gate, is applicable.

Figure 6:
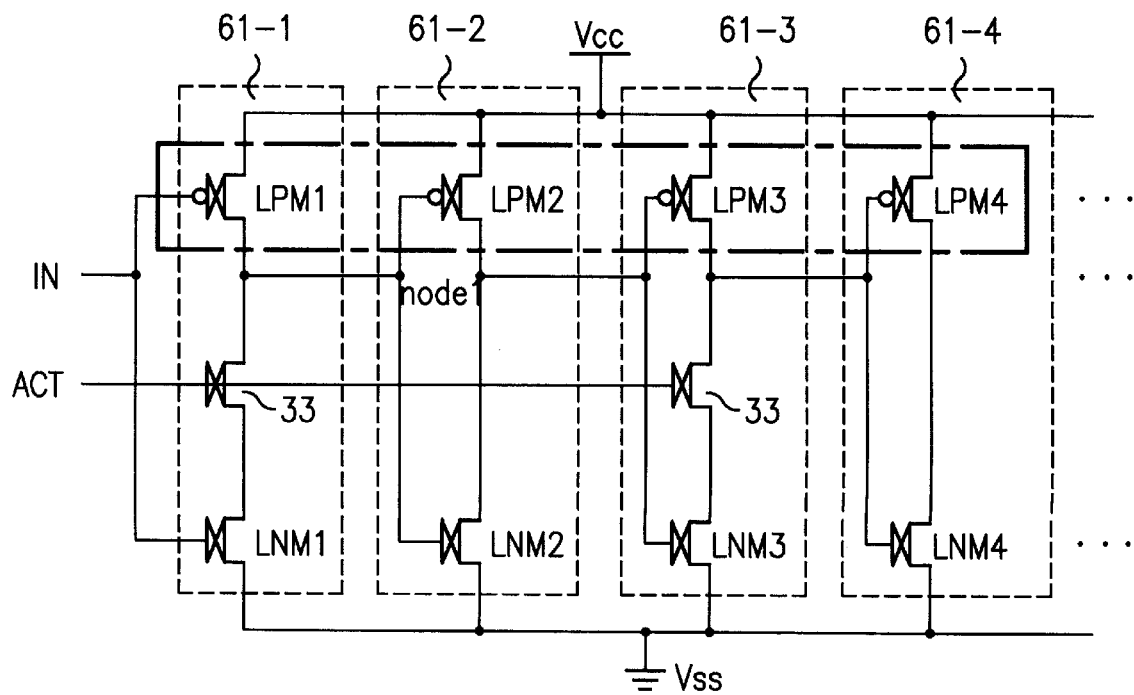
FIG. 6 illustrates a circuit for reducing a standby current in accordance with a third preferred embodiment of the present invention.

FIG. 6 illustrates a circuit for reducing a standby current in accordance with a third preferred embodiment of the present invention.

Referring to FIG. 6, the third embodiment of the present invention includes a plurality of logic circuits 61-1, 61-2, 61-3, 61-4, - - -, provided between a power supply voltage terminal Vcc and a ground voltage terminal Vss, wherein a selection transistor 33 is provided only to the logic circuits of odd numbers 61-1, 61-3, 61-5, - - - . In this instance, inverters formed with PMOS transistors LPM1, LPM2, LPM3, LPM4, - - -, and NMOS transistors LNM1, LNM2, LNM3, LNM4, - - -, both of which have low threshold voltages, are taken as an example of the logic circuits 61-1, 61-2, 61-3, 61-4, - - -. Each of the PMOS transistors LPM1, LPM2, LPM3, LPM4, - - -, in the inverters is formed on an N-well in a P type semiconductor substrate 71 (see FIG. 7). The N-well is biased by Vcc when active. However, in a standby when the N-well voltage is increased to a voltage over the Vcc(for example, Vpp of DRAM), threshold voltages of the PMOS transistors LPM become higher, reducing the sub-threshold leakage. In other words, as shown in FIG. 6, if the selection transistor 33 is provided only to odd numbered logic circuits, the circuit can be held at a standby state by applying a low level signal to a gate of the selection transistor 33 and increasing the N-well voltage. By doing so, node 1 can be charged to a high state through the PMOS transistor LPM1 in the first logic circuit 61-1 regardless of the input signal to the logic circuit. Subsequently, the NMOS transistor LNM2 in the second logic circuit 61-2 is turned on, allowing a leakage current to flow through the PMOS transistor LPM2, but with a substantially reduced rate due to the increased threshold voltage of the PMOS transistor LPM2 by the N-well voltage.

Figure 7:
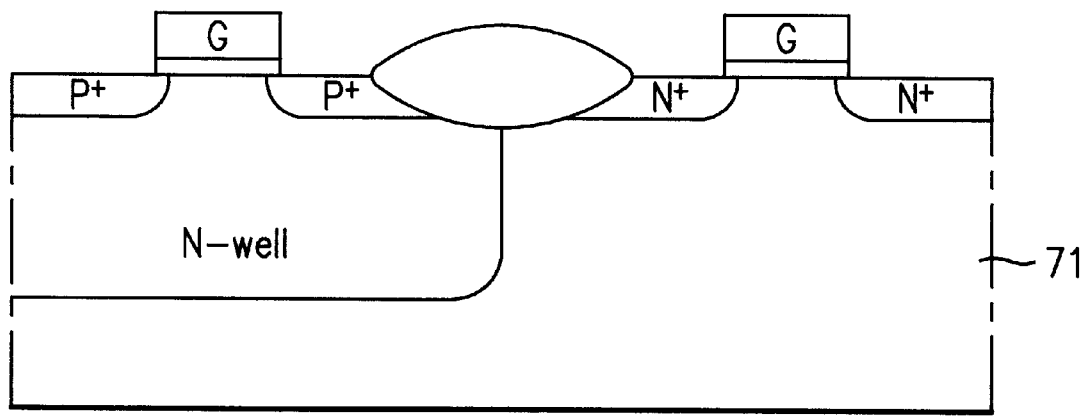
FIG. 7 illustrates a section of a CMOS transistor for explaining FIG. 6.
Figure 8:
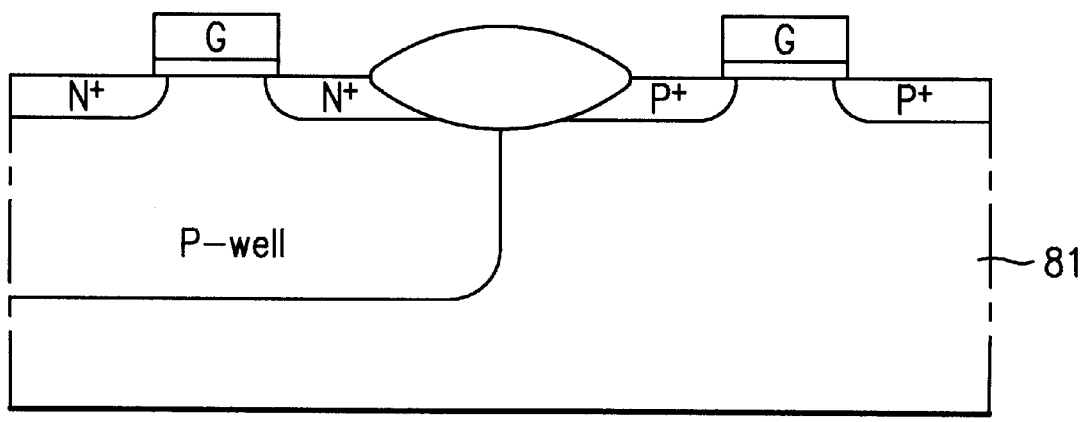
FIG. 8 illustrates another section of a CMOS transistor for explaining FIG. 6.

In the meantime, it is also possible that, while an N-well formed in a P conductive type substrate 71 and the N-well voltage is increased as shown in FIG. 7, a P-well may be formed in an N conductive type substrate 81 and the P-well voltage is reduced as shown in FIG. 8. That is, as shown in FIG. 8, the NMOS transistors LNM1, LNM2, LNM3, LNM4, - - -, in FIG. 6 are formed on a P-well formed in an N conductive type semiconductor substrate 81 as shown in FIG. 8. The P-well is biased by Vss in an active state. However, in a standby state, if the P-well voltage is lowered to a voltage below Vss(for example, Vbb of a DRAM), threshold voltages of the NMOS transistors LNM1, LNM2, LNM3, LNM4, - - -, can become higher, reducing the sub-threshold leakages. Thus, the third embodiment circuit for reducing a standby current with an N-well or a P-well of the present invention is applicable to an output driver, such as a DRAM, for improving a driver processing speed.

The circuit for reducing a standby current of the present invention has the following advantages.

First, the leakage current can be reduced significantly by providing simple switching devices in logic circuits even without providing separate sub-power supply line and sub-ground line.

Second, an output driver with a well bias can improve a processing speed of the driver.

Third, the optimized transistor size allowed by the present invention can reduce a time period required for going from a standby state to an active state, significantly.

Fourth, the circuit for reducing a standby current of the present invention is applicable to automation of circuit design.

It will be apparent to those skilled in the art that various modifications and variations can be made in the circuit for reducing a standby current of the present invention without departing from the spirit or scope of the invention. Thus, it is intended that the present invention cover the modifications and variations of this invention provided they come within the scope of the appended claims and their equivalents.

What is claimed is:

1. A circuit for reducing a standby current, comprising:
   a first plurality of more than two transistor means for coupling to a first prescribed voltage;
   a second plurality of more than two transistor means for coupling to a second prescribed voltage, wherein corresponding ones of the first and second plurality of transistor means are coupled in series between the first and second prescribed voltages;
   a third plurality of more than two switching means for connecting between selected corresponding ones of the first plurality of transistor means and the second plurality of transistor means, wherein the circuit operates in two modes, wherein all of the switching means are active in the first mode, and wherein in the second mode said all of the switching means are inactive for reducing current in each of a plurality of current path means for coupling the first and second plurality of more than two transistor means.

2. The circuit of claim 1, wherein the switching means are transistors, the first prescribed voltage is a supply voltage and the second prescribed voltage is ground.

3. A circuit for reducing a standby current, comprising:
   a first plurality of transistors coupled to a first prescribed voltage;
   a second plurality of transistors coupled to a second prescribed voltage, wherein corresponding ones of the first and second plurality of transistors are coupled in series between the first and second prescribed voltages;
   a third plurality of transistors connected between selected ones of the corresponding ones of the first plurality of transistors and the second plurality of transistors to couple the selected corresponding ones of the first and second plurality of transistors, wherein the first and second plurality of transistors are equal in number, wherein the third plurality of transistors are less in number than the first plurality of transistors, and wherein in a standby mode the third plurality of transistors disconnect the coupling between the corresponding ones of the first and second plurality of transistors.

4. The circuit of claim 3, wherein in the standby mode the third plurality of transistors interrupt a leakage current path between each of the corresponding ones of the first and second plurality of transistors and reduce leakage current in the circuit.

5. The circuit of claim 3, wherein the circuit operates in two modes so that in a first mode all of the third plurality of transistors are active and in the standby mode all of the third plurality of transistors are inactive.

6. The circuit of claim 5, wherein in the first mode all of the first, second and third plurality of transistors are active, and in the standby mode all of the first, second and third plurality of transistors are disconnected and inactive, and wherein the third plurality of transistors each have a control electrode that receives a first control signal.

7. The circuit of claim 3, wherein the first and second plurality of transistors comprise a logic gate.

8. The circuit of claim 7, wherein the logic gate is one of a NAND-gate and a NOR-gate, respectively.

9. The circuit of claim 3, wherein the first, second and third plurality of transistors each comprise more than two transistors.

10. The circuit of claim 3, wherein the first plurality of transistors are coupled by a first electrode to the first prescribed voltage being a supply voltage, and wherein the second plurality of transistors are coupled by a first electrode to the second prescribed voltage being a ground voltage, and wherein each of the corresponding ones of the first and second plurality of transistors form a pair, and wherein a second electrode of each of a first transistor through a penultimate transistor of the first plurality of transistors is connected to control electrodes of an adjacent pair.

11. The circuit of claim 10, wherein first and second electrodes of each of the third plurality of transistors are coupled to second electrodes of the corresponding ones of the first and second plurality of transistors, respectively.

12. The circuit of claim 3, wherein the first plurality of transistors are a first conductivity type, the second plurality of transistors are a second conductivity type, and wherein each of the third plurality of transistors are one of the first conductivity type and the second conductivity type.

13. A circuit, comprising:
   a logic circuit coupled between a supply voltage and a ground voltage, wherein the logic circuit comprises,
   a plurality of current paths between the supply voltage and the ground voltage,
   a first plurality of more than two transistors, and
   a second plurality of more than two transistors, wherein single corresponding ones of the first plurality of transistors and the second plurality of transistors are coupled in series to form a section of each of the current paths; and
   a third plurality of more than two transistors connected between the corresponding ones of the first and second plurality of transistors, wherein all of the third plurality of transistors are active in a first mode of the circuit and all of the third plurality of transistors are inactive in a second mode of the circuit to interrupt said each of the current paths in the second mode.

14. The circuit of claim 13, wherein the first and second plurality of the transistors comprise a logic circuit.

15. The circuit of claim 14, wherein the logic circuit is one of a NAND-gate and a NOR-gate.

* * * * *